United States Patent [19]
Jasper et al.

[11] Patent Number: 5,889,580
[45] Date of Patent: Mar. 30, 1999

[54] SCANNING-SLIT EXPOSURE DEVICE

[75] Inventors: Johannes C.M. Jasper, Veldhoven; Alexander Straaijer, Eindhoven, both of Netherlands

[73] Assignee: ASM Lithography BV, Veldoven, Netherlands

[21] Appl. No.: 824,624

[22] Filed: Mar. 27, 1997

[30] Foreign Application Priority Data

Apr. 1, 1996 [EP] European Pat. Off. .............. 96200882

[51] Int. Cl.$^6$ .................................................. G03B 27/54
[52] U.S. Cl. ................................. 355/67; 355/53; 359/566
[58] Field of Search ................................. 355/50, 53, 67, 355/71; 359/566, 569, 574

[56] References Cited

U.S. PATENT DOCUMENTS

| | | | |
|---|---|---|---|
| 5,289,231 | 2/1994 | Magome et al. | 355/53 |
| 5,291,240 | 3/1994 | Jain | 355/53 |
| 5,329,333 | 7/1994 | Noguchi et al. | 355/53 |
| 5,659,383 | 8/1997 | Ozawa | 355/53 |
| 5,703,675 | 12/1997 | Hirukawa et al. | 355/53 |
| 5,724,122 | 3/1998 | Oskotsky | 355/53 |

FOREIGN PATENT DOCUMENTS 0720056  7/1996  European Pat. Off. .

OTHER PUBLICATIONS

The Phase Fresnel Lens. Kenro Miyamoto. (Jan., 1961). Journal of the Optical Society, vol. (51), No. 1, pp. 17–20.

*Primary Examiner*—Alan A. Mathews
*Attorney, Agent, or Firm*—Pillsbury Madison & Sutro LLP Intellectual Property Group

[57] ABSTRACT

A scanning-slit exposure device is provided with a radiation source (1) emitting radiation pulses through an exit window (2). An imaging system (3) images the exit window onto a surface (4) to be exposed by the radiation. The surface is scanned relative to the exit window image in a scan direction. To avoid the banding-type non-uniformities in the exposure, the device comprises a scattering element (12) which scattering element causes a blur of the exit window image only in the scan direction. The scattering element is arranged in the entrance pupil of the imaging system (3).

20 Claims, 2 Drawing Sheets

SCANNING-SLIT EXPOSURE DEVICE

The invention relates to a scanning-slit exposure device comprising a radiation having an exit window for providing radiation pulses at the exit window to irradiate a surface, an imaging system for imaging the exit window on the surface, and scanning means for scanning the image of the exit window and the surface relative to each other in a scan direction. The invention also relates to a lithographic projection apparatus comprising such a scanning-slit exposure device.

In optical scanning lithography systems exposure dose control is intimately related to exposure uniformity control along the scan direction. Pulsed radiation sources, such as excimer lasers, can readily produce so-called banding type non-uniformities in the exposure even in the absence of pulse-to-pulse fluctuations. In the case of a sharply imaged slit-shaped instantaneous field stop, for instance in the form of an exit window, the non-uniformity takes the form of exposure discontinuities at the locations of the slit edges for each laser pulse.

The article 'Exposure Dose Control Techniques for Excimer laser Lithography' by D. H. Tracy and F. Y. Wu and published in Proceedings of the SPIE, Volume 922 (1988) page 437–443, discloses a scanning slit exposure device according to the preamble in which the exposure discontinuities have been reduced. This known device uses a defocused image of a normal slit as an instantaneous field stop. The resulting defocus blur avoids the high spatial frequencies common to a sharply imaged slit, and reduces the sensitivity of the exposure device to banding. A disadvantage of the known device is that the amount of induced defocus depends on the radiation distribution at the exit window. Devices having an adjustable radiation distribution must therefore also have an adjustable defocus.

It is an object of the invention to provide a scanning-slit exposure device which has a reduced dependence of the induced blur on the radiation distribution at the exit window.

This object is achieved when the device of the preamble is characterized in that a scattering element is arranged in the path of the radiation pulses, which scattering element causes a blur of the exit window image. The use of a scattering element makes the blur less dependent on the radiation distribution at the exit window. This is especially advantageous when using off-axis or variable-coherence illumination for increased depth of field of high numerical aperture projection lenses.

The defocusing in the known device causes spreading of radiation energy not only in the scanning direction but also in a direction perpendicular to it. The non-uniformity of the exposure in the latter direction is not removed by the integrating effect of a series of subsequent radiation pulses. Moreover, the spreading in that direction is not useful for reducing banding-type non-uniformities. The resulting loss of radiation energy of the known device increases the time necessary to accumulate the required radiation dose on the surface, and, hence, the production time of integrated circuits manufactured by the device. Therefore, the scattering element according to the invention preferably causes a blur in the scan direction only. The smearing effect of the instantaneous field stop in the scan direction reduces the banding-type non-uniformities. Because the scattering element does not cause a blur in the direction perpendicular to the scan direction, the image of the slit on the surface to be exposed remains sharp in that direction.

The scattering element is preferably arranged substantially in a pupil of the imaging system in order to further reduce the dependence of the distribution of energy on the surface on the angular distribution of the radiation at the exit window and on the angle of incidence of the radiation on the scattering element. This is advantageous when using the mentioned off-axis or variable-coherence illumination. The pupil may be the entrance pupil or the exit pupil of the imaging system.

The scattering element preferably distributes radiation entering the element along an input angle over exit angles in such a way that the energy of the radiation over the exit angles has substantially a Gaussian distribution. The imaging system converts the Gaussian distribution of the radiation over the exit angles by a convolution with the exit window image into an error-function shaped intensity distribution in the field stop, which very effectively suppresses the banding-type exposure non-uniformities.

In a preferred embodiment of the device according to the invention, the scattering element comprises a transparent plate having a groove pattern. The groove pattern comprises a series of parallel grooves providing the required angular spreading of the incident radiation in one direction only. Such a transparent plate can be manufactured in a relatively cheap way, for instance by a replication technique or any other technique known from the field of grating manufacture.

The exposure device according to the invention can advantageously be used in a lithographic scanning projection apparatus comprising a radiation source having an exit window for providing radiation pulses at the exit window to irradiate a surface of a mask having a pattern, a first imaging system for imaging the exit window on the surface, scanning means for scanning the image of the exit window and the surface of the mask relative to each other in a scan direction, a substrate provided with a radiation-sensitive layer and a projection lens system for imaging the pattern on the substrate. Such a projection apparatus is according to the invention characterized in that a scattering element is arranged in the path of the radiation pulses between the exit window and the mask, which scattering element causes a blur of the exit window image.

These and other aspects of the invention will be apparent from and elucidated with reference to the embodiments described hereinafter.

In the drawings

Figure 1:
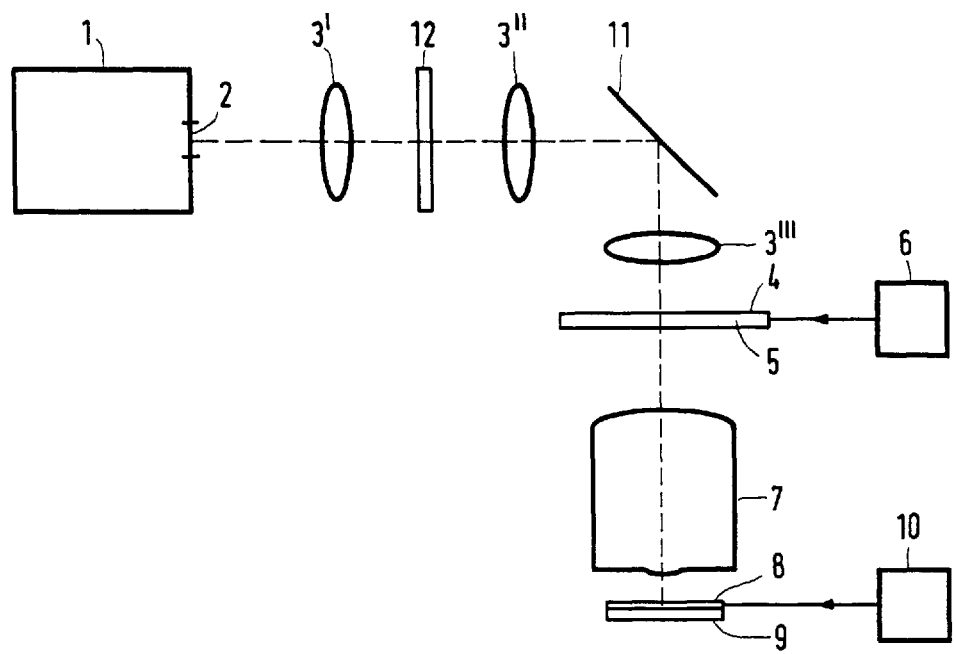
FIG. 1 shows an embodiment of a lithographic scanning projection apparatus according to the invention.

FIG. 1 shows schematically a lithographic scanning projection apparatus according to the invention for the manufacture of microdevices such as for example semiconductor devices, liquid crystal devices or magnetic heads. The apparatus comprises a radiation source 1, for example an excimer laser, emitting radiation pulses at an exit window 2. The exit window may be the exit plane of an optical integrator, for example a quartz rod, forming a uniform intensity distribution over the exit window. The exit window has preferably an elongate shape. An imaging system 3, shown in the Figure as comprising three lenses 3', 3" and 3''', images the exit window 2 on a surface 4 of a mask or reticle 5 having a pattern. The imaging system 3 may be a telescopic system. Scanning means 6, for example a linear actuator, scans the mask 5 in such a way that the entire pattern provided on the surface 4 is illuminated. Alternatively, the mask 5 may be stationary and the exit window 2 scanned. The long direction of the image of the exit window on the mask is perpendicular to the scan direction, i.e. the direction in which the scanning means 6 displace the mask 5 during the exposure to the pulsed radiation. The elements numbered 1 to 6 form a scanning-slit exposure device.

A projection lens system 7, schematically indicated in the Figure by a single component, images the illuminated part of the mask 5 onto a radiation-sensitive layer 8 arranged on a substrate 9. The substrate may be a semiconductor wafer. The projection lens system 7 has preferably a magnifying power of ¼. The substrate 9 is scanned by second scanning means 10 in synchronism with the mask 5 in order to form on the substrate a series of adjacent images of the pattern provided on the surface 4 of the mask 5. A possible scanning sequence is described in the article "Sub-micron 1:1 Optical Lithography" by D.A. Markle in the journal "Semiconductor International" of May 1986, pages 137 to 142. The optical path of the apparatus may be folded by using a mirror 11 in the exposure device.

According to the invention a scattering element 12 is arranged in the path of the radiation pulses between the exit window 2 and the mask 5, preferably in the entrance or exit pupil of the imaging system 3. The element reduces the banding type non-uniformities in the exposure of the mask. The scattering element 12 causes a blur of the exit window image only in the scan direction. If the scan direction of the mask 5 is taken to be in the plane of the drawing, the scattering element 12 causes a blur also in the plane of the drawing. The scattering element should be close enough to one of the pupils that the pattern on the scattering element is not imaged on the surface 4. The distance between the scattering element and the position of a pupil is preferably less than 2% of the distance between the exit window 2 and the surface 4 in order to obtain an intensity distribution on the surface 4 which is substantially independent of the angle of incidence of the radiation on the scattering element.

Figure 2:
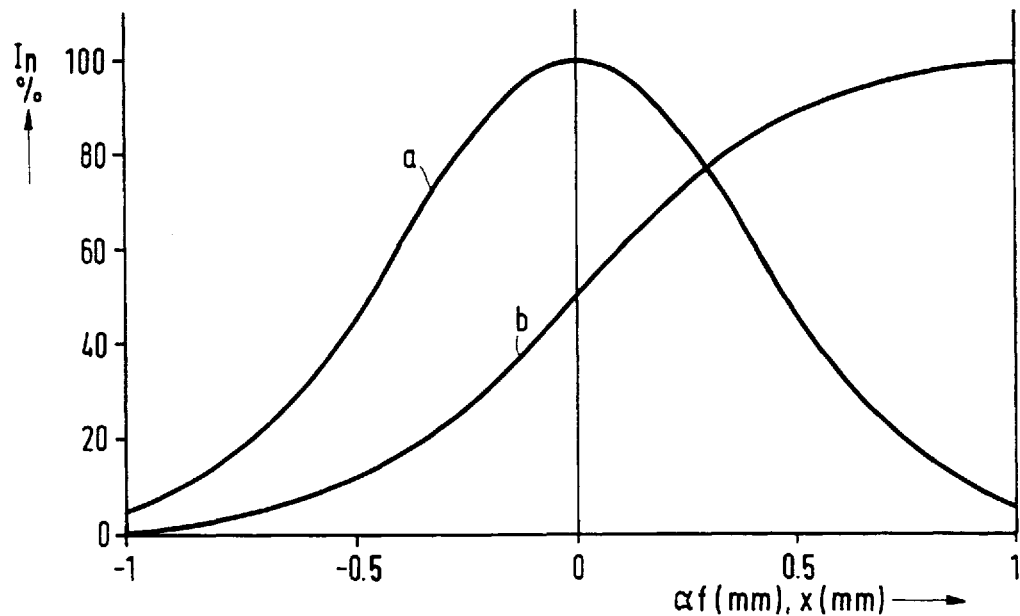
FIG. 2 shows the angular distribution of radiation behind the scattering element and the edge intensity of the image of the exit window.

FIG. 2 shows a graph of the intensity distribution of the radiation in the scan direction caused by a collimated beam incident on the scattering element as a function of the angle immediately after the scattering element 12 (curve a). The normalized intensity $I_n$ of the radiation is plotted along the vertical axis of the graph and the product of the focal length f of the lenses 3" and 3'" and the difference a between the angles of incidence and exit of the scattering plate. The distribution may have any regular shape, but has preferably a Gaussian shape. The Gaussian angular distribution results in an edge intensity of the exit window image on the surface 4 having the shape of an error function, in contrast with a sharp edge of the image when no scattering element is used. The edge intensity is shown as curve b in FIG. 2 for the exit window image on the radiation-sensitive layer 8. The horizontal axis gives for this curve the position x in the scan direction measured from the position of the edge of the image in case there is no scattering element. The error-function-shaped edges of the image result in a very good suppression of the banding-type non-uniformities in the exposure of the layer 8. For a proper suppression the width of the edge of the intensity distribution should be larger than 15% of the width of the exit window image in the scan direction without blur. The width of the error function as shown in FIG. 2 curve b is taken from a function value of 0.001 to 0.999. The edge intensity of curve b can be used for an exit window image having a width of 8 mm.

Figure 3:
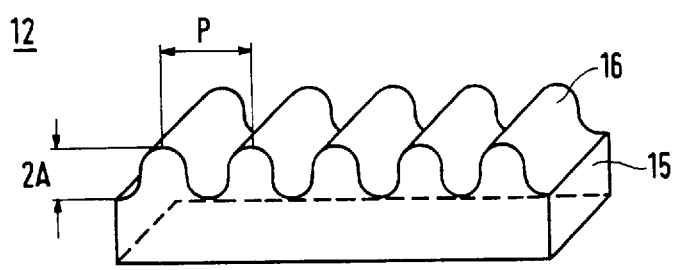
FIG. 3 shows an embodiment of the scattering element.

The scattering element 12 comprise a transparent or reflective substrate having etched or cut grooves with a period larger than the wavelength of the radiation and a depth of a few micrometers. The periodic groove structure of the scattering element 12 causes the light to be distributed over an angular range only in a plane perpendicular to the grooves. FIG. 3 shows an embodiment of the scattering element 12. The element comprises a transparent substrate 15, for example made of glass or quartz, provided with an array of grooves in the form of cylindrical lenses 16. The period P of the lenses is preferably in the range from 0.1 mm to 0.5 mm for easy manufacture. A preferred shape of the cross-section of a cylindrical lens is provided by the following formula giving the height f for half a period of the lens $$f(x) = A \cdot \sqrt{1 - \frac{x^2}{(0.25 \cdot P)^2}}$$

where x is the distance in the plane of the scattering element perpendicular to the groove direction, A is half the peak-valey height of the lens and P is the period of the groove structure. A height A of 1.3 μm and a period P equal to 0.2 mm results in an angular distribution of the radiation having a width at half maximum intensity of approximately 2 degrees. The resulting distribution of the intensity over the angles is substantially Gaussian.

We claim:

1. A scanning-slit exposure device comprising a radiation source having an exit window for providing radiation pulses at the exit window to irradiate a surface, an imaging system for imaging the exit window on the surface, and scanning means for scanning the image of the exit window and the surface relative to each other in a scan direction, characterized in that a scattering element is arranged in the path of the radiation pulses, which scattering element causes a blur of the exit window image.

2. Scanning-slit exposure device according to claim 1, characterized in that the scattering element causes a blur of the exit window image in the scan direction only.

3. Scanning-slit exposure device according to claim 1, characterized in that the scattering element is arranged substantially in a pupil of the imaging system.

4. Scanning-slit exposure device according to claim 1, characterized in that the scattering element distributes radiation entering the element along one input angle over exit angles in such a way that the energy of the radiation over the exit angles has substantially a Gaussian distribution.

5. Scanning slit exposure device according to claim 1, characterized in that the scattering element comprises a transparent plate having a groove pattern.

6. The scanning-slit exposure device of claim 1, wherein said scattering element causes a blur of the exit window image without causing discrete diffraction.

7. The scanning-slit exposure device of claim 1, wherein said scattering element comprises a grating having a pattern of parallel grooves with a pitch in the range 0.1–0.5 mm.

8. The scanning-slit exposure device of claim 1, wherein said scattering element comprises a grating having a pattern of parallel, substantially cylindrical lens elements.

9. The scanning-slit exposure device of claim 6, wherein said scattering element causes a blur of the exit window image in the scan direction only.

10. The scanning-slit exposure device of claim 6, wherein said scattering element is arranged substantially in a pupil of the imaging system.

11. The scanning-slit exposure device of claim 6, wherein said scattering element distributes radiation entering the element along one input angle over exit angles in such a way that the energy of the radiation over the exit angles has substantially a Gaussian distribution.

12. The scanning-slit exposure device of claim 6, wherein said scattering element comprises a transparent plate having a groove pattern.

13. A lithographic scanning projection apparatus comprising a radiation source having an exit window for providing radiation pulses at the exit window to irradiate a surface of a mask having a pattern, a first imaging system for imaging the exit window on the surface, scanning means for scanning the image of the exit window and the surface of the mask relative to each other in a scan direction, a substrate provided with a radiation-sensitive layer and a projection lens system for imaging the pattern on the radiation-sensitive layer, characterized in that a scattering element is arranged in the path of the radiation pulses between the exit window and the mask, which scattering element causes a blur of the exit window image.

14. The lithographic scanning projection apparatus of claim 13, wherein said scattering element causes a blur of the exit window image without causing discrete diffraction.

15. The lithographic scanning projection apparatus of claim 13, wherein said scattering element comprises a grating having a pattern of parallel grooves with a pitch in the range 0.1–0.5 mm.

16. The lithographic scanning projection apparatus of claim 13, wherein said scattering element comprises a grating having a pattern of parallel, substantially cylindrical lens elements.

17. The lithographic scanning projection apparatus of claim 14, wherein said scattering element causes a blur of the exit window image in the scan direction only.

18. The lithographic scanning projection apparatus of claim 14, wherein said scattering element is arranged substantially in a pupil of the imaging system.

19. The lithographic scanning projection apparatus of claim 14, wherein said scattering element distributes radiation entering the element along one input angle over exit angles in such a way that the energy of the radiation over the exit angles has substantially a Gaussian distribution.

20. The lithographic scanning projection apparatus of claim 14, wherein said scattering element comprises a transparent plate having a groove pattern.

\* \* \* \* \*